(12) United States Patent
Ditas et al.

(10) Patent No.: US 12,016,246 B2
(45) Date of Patent: Jun. 18, 2024

(54) ULTRASONIC TRANSDUCER WITH A PIEZOCERAMIC AND METHOD FOR PRODUCING AN ULTRASONIC TRANSDUCER OF THIS KIND

(71) Applicant: PI Ceramic GmbH, Lederhose (DE)

(72) Inventors: Peter Ditas, Münchenbernsdorf (DE); Benjamin Sennfelder, Weida (DE)

(73) Assignee: PI CERAMIC GMBH, Lederhose (DE)

( * ) Notice: Subject to any disclaimer, the term of this patent is extended or adjusted under 35 U.S.C. 154(b) by 996 days.

(21) Appl. No.: 16/965,155

(22) PCT Filed: Dec. 13, 2018

(86) PCT No.: PCT/EP2018/084718
§ 371 (c)(1),
(2) Date: Jul. 27, 2020

(87) PCT Pub. No.: WO2019/149418
PCT Pub. Date: Aug. 8, 2019

(65) Prior Publication Data
US 2021/0048323 A1 Feb. 18, 2021

(30) Foreign Application Priority Data
Jan. 30, 2018 (DE) ............ 10 2018 201 404.3

(51) Int. Cl.
*H10N 30/02* (2023.01)
*B06B 1/06* (2006.01)
(Continued)

(52) U.S. Cl.
CPC .......... *H10N 30/02* (2023.02); *B06B 1/0651* (2013.01); *B06B 1/0666* (2013.01); *H10N 30/88* (2023.02); *G01F 1/66* (2013.01)

(58) Field of Classification Search
CPC ....... G01F 1/66; B06B 1/0666; B06B 1/0651; H10N 30/88; H10N 30/02
See application file for complete search history.

(56) References Cited

FOREIGN PATENT DOCUMENTS

| CN | 106558649 A | 4/2017 |
|---|---|---|
| CN | 106558679 A | 4/2017 |

(Continued)

OTHER PUBLICATIONS

Office Action (Notification of the First Office Action) dated Oct. 11, 2021, by the Chinese Patent Office in corresponding Chinese Patent Application No. 201880087785.7, and an English Translation of the Office Action. (14 pages).

(Continued)

*Primary Examiner* — J. San Martin
(74) *Attorney, Agent, or Firm* — BUCHANAN INGERSOLL & ROONEY PC (57) ABSTRACT

An ultrasonic transducer and a method for producing an ultrasonic transducer are disclosed wherein the ultrasonic transducer has outstanding media resistance and a simpler construction by reducing the number of individual parts, so that the ultrasonic transducer can be produced in a fully-automated production process. The ultrasonic transducer, particularly for measurement of fluid volumes, can include a housing in which a contact element and a piezoceramic are arranged, wherein the piezoceramic includes two electrodes of differing polarity which are attached to different sides of the piezoceramic, wherein contact areas of the two electrodes for making electrical contact are disposed on a same side of the piezoceramic and the contact element includes at least two contact sections of differing polarity which are in electrically conducting contact with the contact areas of the two electrodes of corresponding polarity.

19 Claims, 3 Drawing Sheets

(51) Int. Cl.
  *G01F 1/66* (2022.01)
  *H10N 30/88* (2023.01)

(56) References Cited

FOREIGN PATENT DOCUMENTS

| CN | 107098681 A | | 8/2017 | |
|---|---|---|---|---|
| CN | 107436166 A | | 12/2017 | |
| DE | 3736896 A1 | * | 5/1989 | ........... H10N 30/875 |
| DE | 19820208 A1 | | 7/1999 | |
| DE | 10158015 A1 | | 6/2003 | |
| DE | 102005012041 A1 | | 9/2006 | |
| DE | 102009052814 B3 | * | 5/2011 | ........... B06B 1/0651 |
| DE | 6206 B | * | 1/2016 | ............. G01F 1/662 |
| DE | 202015007840 U1 | * | 1/2016 | ............... G01F 1/66 |
| DE | 102016209830 A1 | | 12/2017 | |
| EP | 2133156 A2 | | 12/2009 | |
| EP | 2267416 A1 | | 12/2010 | |
| JP | 2011250327 A | | 12/2011 | |
| WO | 2011141167 A2 | | 11/2011 | |

OTHER PUBLICATIONS

International Preliminary Report on Patentability (Forms PCT/IB/338 and PCT/IPEA/409) dated Jul. 30, 2020, by the International Bureau of WIPO, in corresponding International Application No. PCT/EP2018/084718. (8 pages).

Office Action dated Sep. 8, 2022, by the European Patent Office in corresponding European Patent Application No. 18822328.3. (3 pages).

Office Action dated Jan. 24, 2022, by the European Patent Office in corresponding European Patent Application No. 18 822 328.3, and an English Translation of the Office Action. (11 pages).

International Search Report (PCT/ISA/210) dated Mar. 19, 2019, by the European Patent Office as the International Searching Authority for International Application No. PCT/EP2018/084718.

Written Opinion (PCT/ISA/237) dated Mar. 19, 2019, by the European Patent Office as the International Searching Authority for International Application No. PCT/EP2018/084718.

* cited by examiner

ULTRASONIC TRANSDUCER WITH A PIEZOCERAMIC AND METHOD FOR PRODUCING AN ULTRASONIC TRANSDUCER OF THIS KIND

The invention relates to an ultrasonic transducer with a piezoceramic and a method for producing an ultrasonic transducer of this kind.

Ultrasonic transducers, which are now employed in many water or heat meters and continuously replace the conventional mechanical flow rate meters, are typically based on the simple composite of an active piezoceramic component and a sound-permeable coupling layer, e.g. a stainless steel membrane.

Various technical solutions exist for electrically contacting the piezoelectric component. One option is the use of spring contacts which, however, can pose a risk in terms of service life with regard to contact corrosion. The contact and the points of contact are subject to a dynamic load during operation which can lead to a change in the transition resistance in the long term. The design and production of such contacts are very demanding. Consistent quality (contact pressure) is essential for the transducers to function in order to ensure low-maintenance operation with a long service life. In many ultrasonic transducers, the contact is also established by soldering wires. The soldering points on the piezoceramic represent additional masses that have an influence on the vibration dynamics of the transducer. Manual soldering processes, in particular, are subject to subjective influences and lead to high manufacturing costs.

DE 101 58 015 A1 discloses such an ultrasonic transducer, in particular for use in a flow meter for liquid or gaseous media.

A flow rate measuring device is known from EP 2 267 416 A1.

DE 198 20 208 A1 discloses a piezoelectric oscillator in which the piezoelectric element is contacted by way of a bipolar supply line. As described above, the formation of solder joints required for the electrical connection of the electrodes of the piezoceramic to the supply line has a detrimental effect on the vibration dynamics of the ultrasonic transducer. The soldering points must be specially formed for each pole of the supply line, which leads to high production costs.

The market for ultrasonic transducers in smart metering applications is under extreme price pressure. Starting out from the above-mentioned prior art, the present invention is based on the object to provide an ultrasonic transducer with excellent media resistance, improved vibration dynamics and simpler design by reducing the number of individual parts, so that the ultrasonic transducer is manufactured in fully automated production.

In satisfying this object, the invention discloses an ultrasonic transducer, in particular for the measurement of fluid volumes. The ultrasonic transducer according to the invention comprises a housing in which a contact element and a piezoceramic are arranged, where the piezoceramic comprises two electrodes of different polarity which are applied to different sides of the piezoceramic, where contact surfaces for the electrical contact of the two electrodes are arranged on the same side of the piezoceramic, and the contact element comprises at least two contact sections of different polarity which are in electrically conductive contact with contact surfaces of the two electrodes of the corresponding polarity. This makes it possible to electrically contact the two electrodes via the same side of the piezoceramic, so that the connection effort is significantly reduced by reducing the number of components required for cabling. The contact surfaces of the piezoceramic can be applied with an electrical alternating voltage via the two contact sections of the contact element in a particularly advantageous manner. A direct mating member for the electrodes of the piezoceramic can be provided, in particular, by using a contact element that comprises two contact sections, and reduce the manufacturing effort for contacting the electrodes of the piezoceramic.

It can be useful to have the respective contact sections of the contact element be in planar contact with the corresponding contact surfaces of the electrodes. A reliable contact of the electrodes can be realized with the planar contact without the introduction of additional mass.

It can be advantageous to have a side of the first electrode facing away from the piezoceramic form the contact surface of the first electrode. This allows the first electrode to be electrically contacted via its rear side.

However, it can also prove to be useful to have the first electrode cover and/or contact a first side of the piezoceramic in part, where the first electrode is preferably arranged centrally on the first side of the piezoceramic, preferably such that a ring-shaped surface remains on the first side of the piezoceramic and is not covered by the first electrode. This configuration favors the symmetrical excitation of the piezoceramic when electrical alternating voltage is applied to the electrodes.

However, it can also be useful to have the second electrode cover and/or contact a second side of the piezoceramic preferably over the entire surface, where preferably at least one contact surface of the second electrode is arranged on the first side of the piezoceramic and is connected by a deflected contact to the second electrode in an electrically conductive manner, where the deflected contact runs preferably over a third side of the piezoceramic. The deflected contact offers an excellent way to separate the contact surface of the second electrode from the electrically active region of the second electrode.

It can also prove helpful to have the second electrode comprise two, three, four or more contact surfaces which are preferably formed identically and/or arranged symmetrically and/or equidistantly around the first electrode, preferably at the edge side on the first side of the piezoceramic. This configuration favors the generation of a particularly symmetrical vibration of the piezoceramic.

It can be useful to have the piezoceramic be formed as a piezoceramic disk or plate and/or extend in a plane. Such configurations are particularly compact and can be produced inexpensively from piezoelectric or piezoceramic material.

It can also be useful to have the housing be produced from ceramic material such as aluminum oxide or plastic material such as PPS, preferably in a casting or injection molding process.

It can also be useful to have the contact sections be located on the same surface of the contact element and/or in the same plane. This makes it possible to establish a particularly easy contact of the contact surfaces of the two electrodes of the piezoceramic.

However, it can also be advantageous to have the contact element be formed to be pot-shaped, where the contact sections are arranged at the base of the contact element and are electrically contactable by way of edge sections of the contact element protruding from the base. This design of the contact element is particularly sturdy and, with the edge sections of the contact element protruding from the base, provides a support surface for a lid. The housing accommodating the piezoceramic can firstly be closed with the lid and, secondly, the contact of the edge sections of the contact element can be accomplished by the lid.

It can be advantageous to have the contact element form a part of the housing and/or be formed as a membrane via which the acoustic coupling of the piezoceramic is effected, where the piezoceramic is preferably adhesively bonded over the entire surface to the contact element. The number of components can be minimized in this embodiment.

However, it can also be useful to have the contact sections be applied as a coating or metallization onto the contact element or be incorporated into the contact element by embedding electrically conductive materials, preferably in particle form. In particular, the contact element can be made of electrically insulating material, where the corresponding contact sections are formed in the aftermath with said techniques. As a result, many different configurations of contact elements can be produced with little effort.

However, it can also be useful to have the housing comprise a lid with electrodes of different polarity, where the electrodes are in electrically conductive connection to the contact sections of corresponding polarity when the lid is closed, so that the piezoceramic can be acted upon with an alternating voltage through the electrodes of the lid. In this configuration, the piezoceramic and the contact element are protected inside a closed housing. In addition, establishing the contact between the piezoceramic and the contact element is coupled to the closing state of the lid, so that the contact between the piezoceramic and the contact element being established can be verified already optically—namely by examining the closing state of the lid.

However, it can also prove advantageous to have the electrodes be arranged on the outer side of the lid when the lid is closed and be in electrically conductive connection preferably by way of vias to terminals of corresponding polarity on the inner side of the lid, where the terminals on the inner side of the lid are in electrically conductive connection to and/or in contact with the contact sections of corresponding polarity when the lid is closed. In this configuration, the piezoceramic can be acted upon with an electrical alternating voltage in a particularly simple and convenient manner, while the piezoceramic and the contact element are protected within a closed housing.

A further aspect of the present invention relates to a method for producing an ultrasonic transducer according to the preceding embodiment, comprising the steps of:

a. arranging the piezoceramic in the housing so that the contact surfaces of the piezoceramic are in electrically conductive contact with the contact sections of corresponding polarity of the contact element;
b. closing the housing with the lid.

The above advantages for the preceding configuration of the ultrasonic transducer apply accordingly to the method for its production.

Important terms and definitions in the context of the invention claimed shall be explained below:

Terms and Definitions

The term fluid refers to a liquid or a gas.

The term piezoceramic refers to a piezoelectric element which is in particular formed to be disk-shaped and preferably extends in a plane.

The piezoceramic can have the following features:
The piezoceramic is made of piezoceramic material.
The piezoceramic is formed as a disk or plate.
The piezoceramic comprises a first side and a second side facing away therefrom, where the first side and the second side are preferably arranged exactly or substantially parallel to each other.
The piezoceramic has a circular disk shape or a flat cylindrical shape, the axial end sides of which form the first and the second side of the piezoceramic, where the lateral surface forms a third side of the piezoceramic.

The first electrode can have the following features:
The first electrode has a circular disk shape.
The first electrode is arranged at the center on the first side of the piezoceramic.
The first electrode is applied with its entire surface onto the first side of the piezoceramic, preferably in a sputtering process.
The first electrode covers the first side of the piezoceramic in part, so that outside of the first electrode, a preferably ring-shaped edge not covered by the first electrode remains on the first side of the piezoceramic.
The first electrode on its side facing away from the piezoceramic comprises a contact surface for the electrical contact to the first electrode.

The second electrode can have the following features:
The second electrode has a circular disk shape.
The second electrode is arranged on the second side of the piezoceramic.
The second electrode covers the second side of the piezoceramic over the entire surface.
The second electrode is applied with its entire surface onto the second side of the piezoceramic, preferably in a sputtering process.
The second electrode comprises at least one contact surface arranged on the same side of the piezoceramic as a contact surface of the first electrode, where the contact surface is connected via a deflected contact to the part of the second electrode arranged on the second side of the piezoceramic. The deflected contact is preferably formed as a strip-like flat conductor and runs at least over a third side of the piezoceramic.
The second electrode comprises two, three, four or more contact surfaces which are arranges preferably symmetrically and/or equidistantly on the same side of the piezoceramic as a contact surface of the first electrode. The contact surfaces are preferably arranged at the edge side on the respective side of the piezoceramic. The shape of each contact surface can correspond exactly or substantially to a semicircle. The second electrode preferably comprises four identically formed, preferably semicircular contact surfaces which are arranged at angular distances of about 90° symmetrically and equidistantly on the first side of the piezoceramic.

The contact element can have the following features:
The contact element is formed to be circular disk-shaped.
The contact element comprises a first contact section extending in a strip-shaped manner diametrically over a first side of the contact element, where a preferably substantially circular section is formed at the center of the first side of the contact element and is matched to the shape and dimensions of the contact surface of the first electrode of the piezoceramic for contacting the contact surface of the first electrode of the piezoceramic over the entire surface in the connected state.
The contact element comprises two second contact sections arranged on the first side of the contact element on both sides of the first contact section and isolated therefrom for contacting the contact surfaces of the second electrode of the piezoceramic in the connected state.

The contact element is formed to be pot-shaped, where a preferably circumferential edge protrudes from the first side or from the base of the contact element, respectively, where edge sections for the electrical contact of the contact sections are formed at the upper edge of the contact element. The protrusion of the edge sections over the base of the contact element is preferably greater than the height of the piezoceramic. The inner diameter or inner circumference of the edge protruding from the base of the contact element is preferably in the range of 120 to 200% of the outer diameter or outer circumference of the piezoceramic.

The contact element is formed as a membrane for acoustic coupling of the piezoceramic.

The contact element is firmly joined with the piezoceramic, preferably adhesively bonded.

The contact element is produced from electrically insulating material, where the first and second contact sections made of electrically conductive material are subsequently applied to the contact element, for example as a metallization or as a coating, or where the first and second contact sections made of electrically conductive material are incorporated into the contact element in the form of embedded electrically conductive particles.

The housing can have the following features:

The housing comprises a pot-shaped housing lower part and a lid.

The lid of the housing comprises a printed circuit board or is formed as a printed circuit board. The printed circuit board can comprise electrodes of different polarity for an electrical alternating voltage acting upon the piezoceramic. The electrodes of the printed circuit board are preferably located on the outer side of the printed circuit board or the housing when the housing is closed. The electrodes of the printed circuit board are preferably connected to terminals of corresponding polarity on the inner side of the printed circuit board, for example by way of vias. The printed circuit board is mountable preferably only in a certain rotational position on the housing lower part, so that the terminals are in electrically conductive contact with the edge sections for the electrical contact of the contact sections of the contact element when the lid is closed. The contact pressure between the terminals and the edge sections for the electrical contact of the contact sections of the contact element can be increased as needed, for example, by pressing the lid on. The terminals are matched according to shape and dimensions preferably to the positions of the edge sections for the electrical contact of the contact sections of the contact element.

The housing is produced from electrically insulating material.

The housing is made of structural ceramics, preferably aluminum oxide.

The housing is made of plastic material, preferably PPS. At least the pot-shaped housing lower part is preferably made of plastic material in an injection molding process.

The housing comprises a flat cylindrical and preferably rotationally symmetrical shape.

The housing comprises a diameter in the range of 150 to 300% of the diameter of the piezoceramic.

The housing comprises a height or axial length which is in the range of 150 to 500% of the height or axial length of the piezoceramic.

The piezoceramic and/or the contact element is/are arranged at the center of the housing or concentrically to an axis of the housing.

Further advantageous developments of the entire invention shall arise from combinations of the features disclosed in the specification, the claims, and the drawings.

DETAILED DESCRIPTION OF THE PREFERRED EMBODIMENTS

The preferred embodiments of the present invention shall be described in detail below with reference to the drawings appended.

The preferred embodiment of the invention comprises an ultrasonic transducer 1 in the form of a media resistant ultrasonic transducer consisting of a pot-like housing 2 made of structural ceramics (e.g. aluminum oxide) with a structured electrode in the base in the form of contact element 2c formed with contact sections 8, 9, on which structured piezoceramic 3 is glued with a specially adapted deflected contact design (cf. FIGS. 1 to 6). While a chemically resistant material, oxide ceramics, is used as a membrane and the electrical conductivity is enabled by the structured metallization of contact element 2c in the form of contact sections 8, 9, the innovation is to electrically contact piezoceramic 3 exclusively via the pot. Piezoceramic 3 therefore does not need to be additionally contacted by spring pins or wires and loaded or damped therewith. The sensor is ultimately closed by a printed circuit board 2d glued into housing 2 and can ultimately be contacted thereby as desired.

The alternative principle of contacting via a structured electrode can of course be transferred not only to a pot, but also to a differently shaped or designed membrane.

A configuration of the housing with plastic material (e.g. PPS) is also conceivable. For example, punching screens can be injected by injection molding technology for the electrical contact. Another alternative to the creation of the specific electrode structure in the housing is the metallization of the plastic material, there are technical solutions also in this field.

Figure 1:
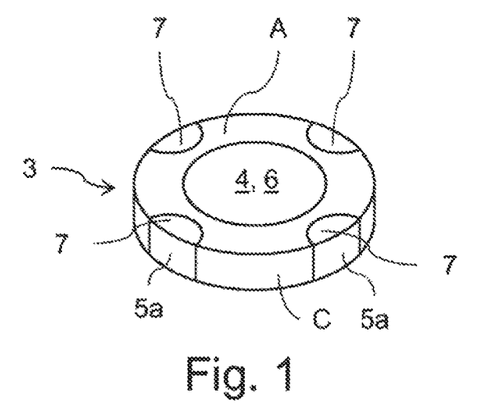
FIG. 1 shows a perspective view of piezoceramic of the ultrasonic transducer according to the invention with a view onto the first side (underside), where the piezoceramic is formed as a flat cylindrical piezoceramic disk and the first electrode (plus) is formed to be circular and applied at the center over the entire surface onto the first side (underside) of the piezoceramic in a sputtering process, so that a ring-shaped edge remains on the first side of the piezoceramic and is not covered by the first electrode and in which a total of four semicircular contact surfaces of the second electrode (minus) are arranged on the edge side symmetrically and equidistantly contested [SIC spaced] from each other.
Figure 2:
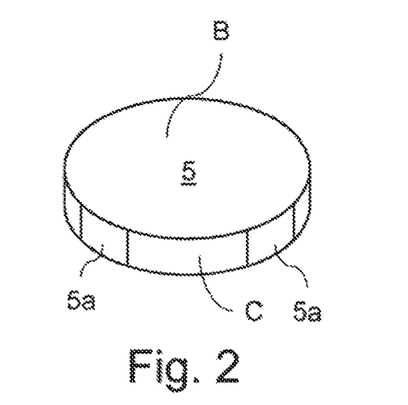
FIG. 2 shows a perspective view of the piezoceramic according to FIG. 1 with a view onto the second side (upper side) which is covered by a second circular electrode applied over the entire surface in a sputtering process (minus), where deflected contacts lead from the second electrode over the lateral surface of the piezoceramic to the contact surfaces of the second electrode on the first side of the piezoceramic.
Figure 3:
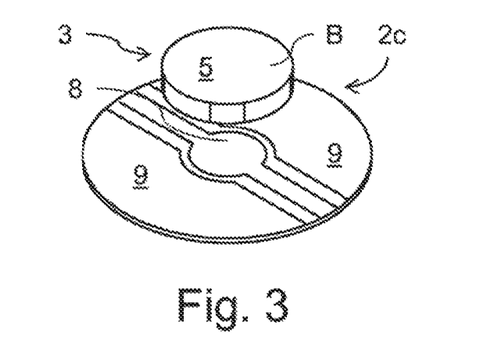
FIG. 3 shows a perspective exploded view of an arrangement comprising the piezoceramic according to FIG. 2 as well as a contact element with contact sections of different polarity which can be made to contact the contact surfaces of the piezoceramic for establishing an electrically conductive connection, where the contact element is formed to be circular and the first contact section (plus) extends in a strip-shaped manner diametrically over the center of the contact element to form a circular center section, and where two second contact sections (minus) are arranged on both sides of the first contact section and are formed to be substantially semicircular.
Figure 4:
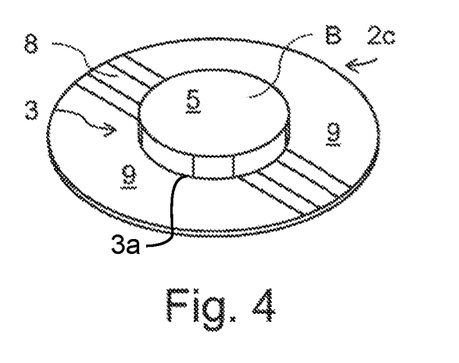
FIG. 4 shows a perspective view of the arrangement according to FIG. 3 in a state in which the piezoceramic is arranged as intended on the contact element, so that the contact surfaces of the piezoceramic are in electrically conductive contact with the contact sections of corresponding polarity of the contact element.
Figure 5:
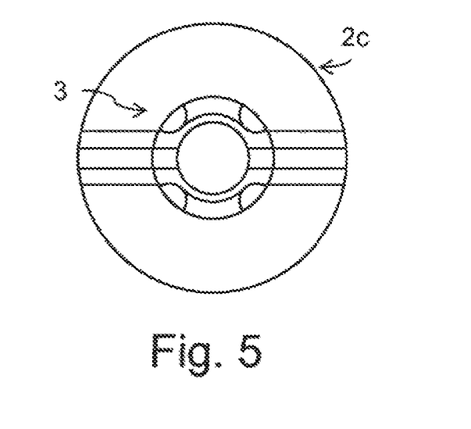
FIG. 5 shows a bottom view of the arrangement according to FIG. 4, where the contact element is diagramed in part transparent.
Figure 6:
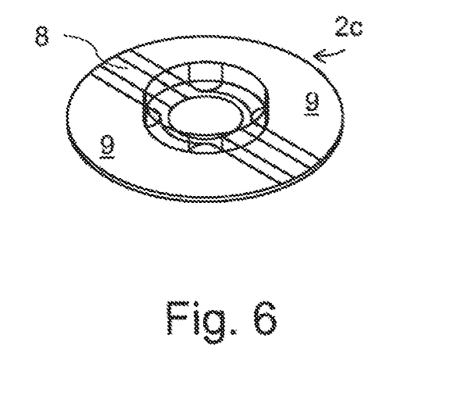
FIG. 6 shows a perspective view of the arrangement according to FIG. 4 or 5 with a view onto the second side (upper side) of the piezoceramic, where the piezoceramic is diagramed in part transparent.
Figure 7:
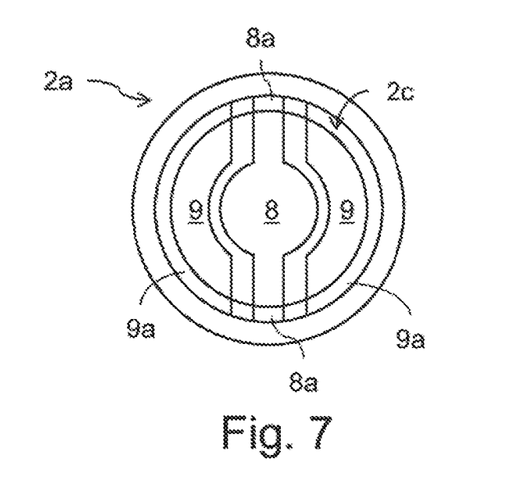
FIG. 7 shows a top view of an arrangement comprising a pot-shaped housing lower part and a pot-shaped contact element, where the contact element is formed to be similar to the contact element shown in FIG. 3 and a circumferential edge additionally rises at the edge side from the base of the contact element, where the contact sections of different polarity at the base of the contact element can be contacted via corresponding edge sections on the upper end of the circumferential edge.
Figure 8:
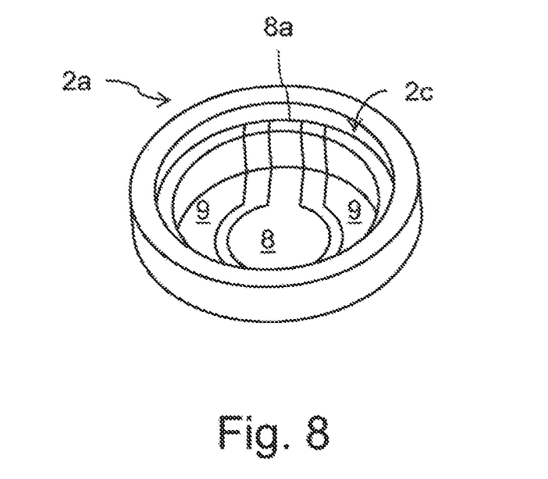
FIG. 8 shows a perspective top view of the arrangement according to FIG. 7.
Figure 9:
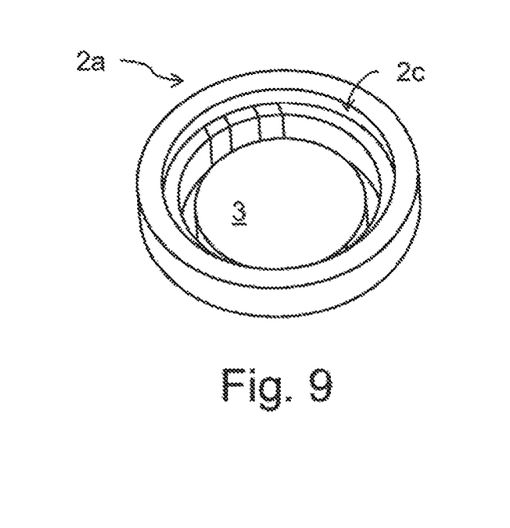
FIG. 9 shows a perspective top view of the arrangement according to FIG. 7 in a state in which the piezoceramic according to FIG. 2 is arranged as intended on the contact element, so that the contact surfaces of the piezoceramic are in electrically conductive contact with the contact sections of corresponding polarity of the contact element.
Figure 10:
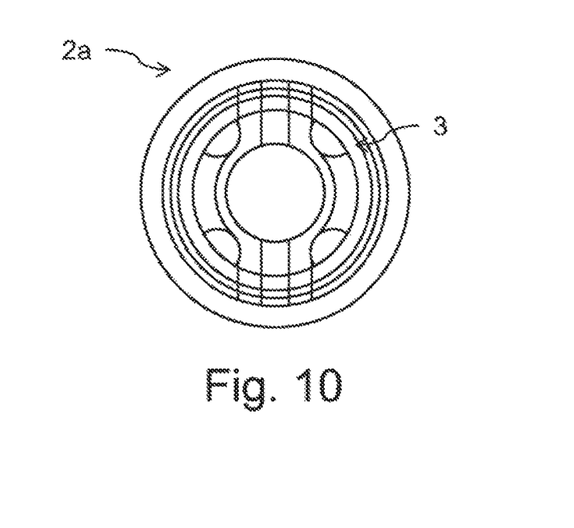
FIG. 10 shows a bottom view of the arrangement according to FIG. 9, where the housing lower part as well as the contact element are diagramed in part transparent.

In detail, ultrasonic transducer 1 according to the invention comprises the following components:

FIGS. 1 and 2 show a configuration of piezoceramic 3 for an ultrasonic transducer 1 according to the invention for the measurement of fluid volumes. Piezoceramic 3 is formed to be flat cylindrical or circular disk-shaped and extends substantially in a plane, where two circular electrodes 4, 5 of different polarity are applied onto different sides A, B of piezoceramic 3. The thickness of piezoceramic 3 or the spacing of the two sides A, respectively, is approximately in the range of 10% to 25% of the diameter of piezoceramic 3.

First electrode 4 in part covers and contacts a first side A of piezoceramic 3 and is applied at the center onto first side A of piezoceramic 3 in a planar manner by a sputtering process. A ring-shaped surface remains all around first electrode 4 on first side A of piezoceramic 3 and is not covered by first electrode 4. A side of first electrode 4 facing away from piezoceramic 3 forms contact surface 6 of first electrode 4.

Second electrode 5 applied in a planar manner by a sputtering process covers and contacts a second side B of piezoceramic 3 over the entire surface. A total of four contact surfaces 7 of second electrode 5 are symmetrical on the edge side and arranged equidistantly in angular distances of approx. 90° to the center axis of piezoceramic 3 on first side A of piezoceramic 3 and are each connected via a deflected contact 5a extending over lateral surface C of piezoceramic 3 in an electrically conductive manner to the active part of second electrode 5. Consequently, contact surfaces 6, 7 are arranged on same side A of piezoceramic 3 for the electrical contact of the two electrodes 4, 5. Contact surfaces 7 of second electrode 5 are formed to be substantially semicircular.

In addition to piezoceramic 3 shown in FIGS. 1 and 2, a contact element 2c is shown in FIGS. 3 to 6 and comprises at least two contact sections 8, 9 of different polarity which can be made to electrically conductively contact contact surfaces 6, 7 of the two electrodes 4, 5 of corresponding polarity.

Contact element 2c in the configuration according to FIGS. 3 to 6 is formed to be circular disk-shaped and extends in a plane. The diameter of contact element 2c is approximately in the range of 150% to 300% of the diameter of piezoceramic 3. A first contact section 8 for contacting first electrode 4 (plus) of piezoceramic 3 extends substantially in a strip-shaped manner diametrically over the surface of contact element 2c to form at the center of the surface of contact element 2c an approximately circular disk-shaped section which is intended to contact contact surface 6 of first electrode 4 and is matched in its dimensions to contact surface 6 of first electrode 4. First contact section 8 is flanked on the edge side by insulating sections separating first contact section 8 from second contact sections 9 arranged on two sides of the former and formed to be substantially semicircular. Second contact sections 9 are provided and formed to get into electrically conductive contact with contact surfaces 7 of second electrode 5 when piezoceramic 3 is arranged according to the intended use on contact element 2c and glued thereto in a planar manner. First and second contact sections 8, 9 are located in the same plane and on the same surface of contact element 2c. Contact element 2c can be formed as a membrane via which the acoustic coupling of piezoceramic 3 is effected. Contact sections 8, 9 are applied to contact element 2c, for example, as a coating or metallization, or are incorporated into contact element 2c by embedding electrically conductive materials, for example, in particle form.

In an alternative embodiment according to FIGS. 7 to 10, contact element 2c can be formed to be pot-shaped and inserted into a lower pot-shaped housing part 2a or form a part of housing 2, where first and second contact sections 8 and 9 are arranged substantially similar to the embodiment according to FIGS. 3 to 6 at the base of contact element 2c, while, unlike in FIGS. 3 to 6, edge sections 8a, 9a protrude on the edge side from the base of contact element 2c for the electrical contact to contact sections 8 and 9. The dimensions of the receptacle formed by lower pot-shaped housing part 2a exceed the dimensions of piezoceramic 3, so that piezoceramic 3 is completely enclosed in the receptacle.

Figure 11:
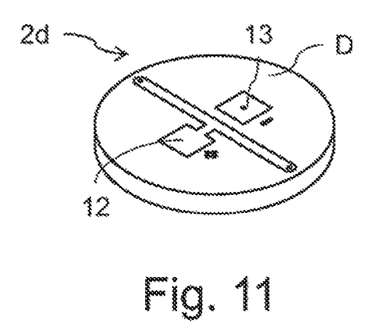
FIG. 11 shows a perspective top view of a printed circuit board with electrodes of different polarity via which an electrical alternating voltage can be applied to the electrodes of the piezoceramic, where the printed circuit board forms a lid for closing the housing lower part shown in FIGS. 7 to 10.
Figure 12:
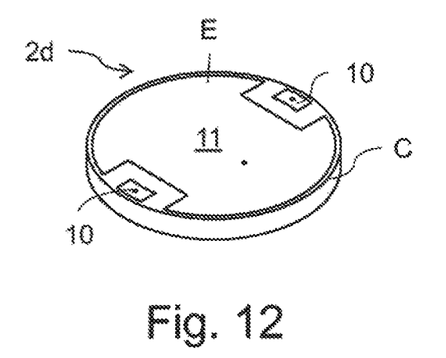
FIG. 12 shows a perspective bottom view of the printed circuit board according to FIG. 11, where terminals of different polarity for contacting the edge sections of corresponding polarity of the contact element shown in FIGS. 7 to 9 are arranged at the underside or the inner side of the printed circuit board, respectively, where the terminals are in electrically conductive connection by way of vias to the electrodes on the outer side.

FIGS. 11 and 12 show a printed circuit board 2d which forms a lid 2b for closing lower pot-shaped housing part 2a according to FIGS. 7 to 10.

Figure 13:
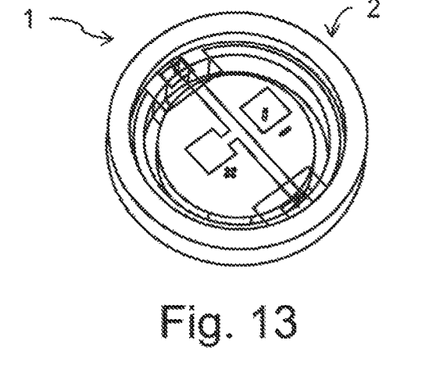
FIG. 13 shows a perspective top view of an ultrasonic transducer according to the invention, comprising the arrangement shown in FIG. 9 in combination with the piezoceramic shown in FIG. 2, where the printed circuit board closes the housing lower part shown in FIGS. 7 to 10, so that the terminals on the inner side of the lid are in electrically conductive contact with the edge sections of corresponding polarity of the contact element, where the printed circuit board is diagramed in part transparent.
Figure 14:
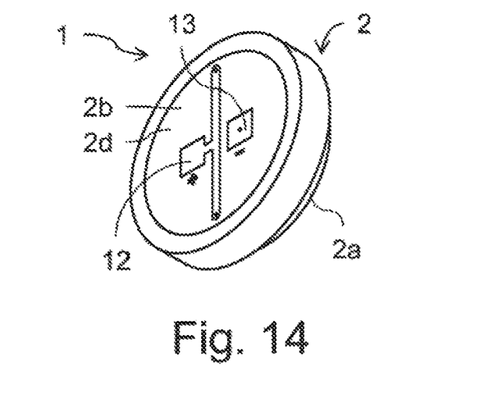
FIG. 14 shows a further perspective top view of the ultrasonic transducer according to FIG. 13.

FIGS. 13 and 14 show an ultrasonic transducer 1 according to the invention that is configured in particular for the measurement of fluid volumes. This ultrasonic transducer 1 comprises a housing 2 which consists of lower pot-shaped housing part 2a according to FIGS. 7 to 10 and lid 2b formed as a printed circuit board 2d according to FIGS. 11 and 12. Housing 2 can be produced from ceramic material—such as aluminum oxide—or from plastic material—such as PPS—where a housing made of plastic material is preferably manufactured in a casting or injection molding process. A contact element 2c and piezoceramic 3 according to FIGS. 1 and 2 are arranged in the housing such that contact sections 8, 9 of different polarity of contact element 2c are in electrically conductive contact with contact surfaces 6, 7 of the two electrodes 4, 5 of corresponding polarity.

Lid 2b comprises electrodes 12, 13 of different polarity on first side D which are arranged on the outer side of lid 2b or housing 2, respectively, when lid 2b is closed and protrude over edge sections 8a, 9a in an electrically conductive connection to contact sections 8, 9 of corresponding polarity, so that piezoceramic 3 is acted upon with an alternating voltage via the electrodes of lid 2b. Via corresponding vias, electrodes 12, 13 are in electrically conductive connection to terminals 10, 11 of corresponding polarity on inner side E of lid 2b. Terminals 10, 11 on inner side E of lid 2b establish an electrical contact to edge sections 8a and 9a of contact element 2c when lid 2b is closed and are in electrically conductive connection to contact sections 8, 9 of corresponding polarity.

In order to excite piezoceramic 3 to vibrate, an electric alternating field must be created in piezoceramic 3. This is done by applying an alternating voltage to electrodes 4, 5 of piezoceramic 3 that are applied in a planar manner.

Due to deflected contact 5a running over lateral surface C of piezoceramic 3, contact surfaces 6, 7 of the two electrodes 4, 5 of piezoceramic 3, i.e. the contact points for the plus and minus pole, can be accommodated on one side of piezoceramic 3.

Piezoceramic 3 has a symmetrical design for the formation of an optimal sonic beam, where centrally arranged first electrode 4 forms an active region for the generation of sound and a passive region with four deflected contacts 5a and contact surfaces 7 is additionally present.

The substrate formed as contact element 2c can be realized inexpensively, for example, by way of a sputtering process (physical vapor deposition or PVD).

The acoustic coupling of piezoceramic 3 to contact element 2c is effected by adhesive bonding over the entire surface. The electrical contact of piezoceramic 3 to contact element 2c is simultaneously created by the adhesive bonding 3a, so that no additional contacting is necessary, for example, by soldering or spring contacts. The galvanic contact between piezoceramic 3 and contact element 2c is realized by the surface roughness of the joined partners. Conductive adhesive is therefore not mandatory. The contact of center electrode (plus pole) 4 and contact surfaces 7 of minus pole 5 of piezoceramic 3 on contact element 2c is enabled by the special electrode structure in the form of contact sections 8, 9 and the special positioning of piezoceramic 3.

Contacting the two electrodes 4, 5 of piezoceramic 3 to contact element 2c is therefore particularly easy. Function-determining adhesive bonding (acoustic coupling) and electrical contacting are possible in one assembly step.

The above-described arrangement can be mounted in a housing 2 with corresponding electrical contact sections 8, 9. Another option is to implement the above design into a pot-shaped housing 2a.

An implementation or integration of contact element 2c into housing 2 is possible, where housing 2 can be produced from structural ceramic or plastic material. The continuation of the electrode tracks of contact sections 8, 9 is effected, for example, via the metallization (e.g. by way of PVD) of the inner wall of contact element 2c and/or of housing 2 on contacting surfaces in an easily accessible shoulder in housing 2. The inner metallization of housing 2 provides additional shielding.

The closure of housing 2 is effected with a lid 2b in the form of printed circuit board 2d (FR4), where the design of printed circuit board 2d can also be implemented in hybrid technology (printed circuit on aluminum oxide ceramics).

Adhesive bonding of printed circuit board 2d to remaining housing 2 can be done with non-conductive adhesive, where the galvanic contact between the contact surfaces of housing 2 and the PCB electrode surfaces is effected through the surface roughness.

The ultrasonic transducer 1 according to the invention therefore consists only of three parts with the integrated contacting of piezo disk 3. This results in a defined interface to the meter electronics (soldering contact or plug connectors) as well as simple automatable assembly and connection technology, where the assembly can be done from one side.

LIST OF REFERENCE NUMERALS 1 ultrasonic transducer
2 housing
2a pot
2b lid
2c contact element
2d printed circuit board
3 piezo ceramics
3a adhesive bond
4 electrode (plus) (piezoceramic)
5 electrode (minus) (piezoceramic)
5a deflected contact electrode (minus)
6 contact surface of the electrode (plus)
7 contact surface of the electrode (minus)
8 contact section for electrode (plus)
8a edge of the contact element for contacting the contact section (plus)
9 contact section for electrode (minus)
9a edge of the contact element for contacting the contact section (minus)
10 terminal (plus) (lid inner side)
11 terminal (minus) (lid inner side)
12 electrode (plus) (lid)
13 electrode (minus) (lid)

A first side (underside) of the piezoceramic
B second side (upper side) of the piezoceramic
C third side (lateral surface) of the piezoceramic
D outer side of the lid
E inner side of the lid

The invention claimed is:

1. An ultrasonic transducer for the measurement of fluid volumes, comprising:
 a housing in which a contact element and a piezoceramic are arranged, where said piezoceramic includes two electrodes of different polarity which are applied onto different sides of said piezoceramic, where contact surfaces for electrical contact of said two electrodes are arranged on the same side of said piezoceramic; and
 said contact element including at least two contact sections of different polarity which are in electrically conductive contact with said contact surfaces of said two electrodes of corresponding polarity, where said contact element forms a part of said housing, wherein
 said contact element is pot-shaped, where said contact sections are arranged at a base of said contact element and are electrically contactable by way of edge sections of said contact element protruding from said base.

2. The ultrasonic transducer according to claim 1, wherein respective contact sections of said contact element are in planar contact with corresponding contact surfaces of said electrodes.

3. The ultrasonic transducer according to claim 1, wherein a side of a first electrode of said two electrodes facing away from said piezoceramic forms said contact surface of said first electrode.

4. The ultrasonic transducer according to claim 1, wherein a first electrode of said two electrodes in part at least one of covers and contacts a first side of said piezoceramic, where said first electrode is arranged centrally on said first side of said piezoceramic, such that a ring-shaped surface remains on said first side of said piezoceramic and is not covered by said first electrode.

5. The ultrasonic transducer according to claim 4, wherein a second of said two electrodes at least one of covers and contacts a second side of said piezoceramic over an entire surface, where at least one contact surface of said second electrode is arranged on said first side of said piezoceramic and is connected by a deflected contact to said second electrode in an electrically conductive manner, where said deflected contact runs over a third side of said piezoceramic.

6. The ultrasonic transducer according to claim 5, wherein said second electrode comprises:
 two, three, four or more contact surfaces which are at least one of formed identically, arranged symmetrically, and arranged equidistantly around said first electrode at an edge side on said first side of said piezoceramic.

7. The ultrasonic transducer according to claim 1, wherein said piezoceramic at least one of is formed as a piezoceramic disk or plate and extends in a plane.

8. The ultrasonic transducer according to claim 1, wherein said housing is of at least one of ceramic material or plastic material.

9. The ultrasonic transducer according to claim 1, wherein said contact sections are at least one of located on a same surface of said contact element and located in a same plane.

10. The ultrasonic transducer according to claim 1, wherein said contact element is formed as a membrane, configured for acoustic coupling of said piezoceramic, and said piezoceramic includes an adhesive bond over an entire surface to said contact element.

11. The ultrasonic transducer according to claim 1, wherein said contact sections are at least one of coated sections of said contact element, metallized sections of said contact element, or are incorporated into said contact element as embedded electrically conductive materials.

12. The ultrasonic transducer according to claim 1, wherein said housing comprises:
 a lid with electrodes of different polarity, where said electrodes are in electrically conductive connection to said contact sections of corresponding polarity when said lid is closed, so that said piezoceramic will be acted upon with an alternating voltage through said electrodes of said lid.

13. The ultrasonic transducer according to claim 12, wherein said electrodes are arranged on an outer side of said lid when said lid is closed and are in electrically conductive connection by way of vias to terminals of corresponding polarity on an inner side of said lid, where said terminals on said inner side of said lid are at least one of in electrically conductive connection to and in contact with said contact sections of corresponding polarity when said lid is closed.

14. The ultrasonic transducer according to claim 1, wherein said housing is of at least one of ceramic aluminum oxide material, PPS cast plastic material, or PPS injection molded plastic material.

15. The ultrasonic transducer according to claim 1, wherein said contact sections are incorporated into said contact element as embedded electrically conductive materials in particle form.

16. The ultrasonic transducer according to claim 2, wherein a side of a first electrode of said two electrodes facing away from said piezoceramic forms said contact surface of said first electrode.

17. The ultrasonic transducer according to claim 16, wherein a first electrode of said two electrodes in part at least one of covers and contacts a first side of said piezoceramic, where said first electrode is arranged centrally on said first side of said piezoceramic, such that a ring-shaped surface remains on said first side of said piezoceramic and is not covered by said first electrode.

18. The ultrasonic transducer according to claim 17, wherein a second of said two electrodes at least one of covers and contacts a second side of said piezoceramic over an entire surface, where at least one contact surface of said second electrode is arranged on said first side of said piezoceramic and is connected by a deflected contact to said second electrode in an electrically conductive manner, where said deflected contact runs over a third side of said piezoceramic.

19. A method for producing an ultrasonic transducer for the measurement of fluid volumes, the ultrasonic transducer including:
 a housing in which a contact element and a piezoceramic are arranged, where said piezoceramic includes two electrodes of different polarity which are applied onto different sides of the piezoceramic, where contact surfaces for electrical contact of the two electrodes are arranged on the same side of the piezoceramic; and
 the contact element includes at least two contact sections of different polarity, where the contact element forms a part of the housing, wherein
 the contact element is pot-shaped, where the contact sections are arranged at a base of the contact element and are electrically contactable by way of edge sections of the contact element protruding from the base, the method comprising:

a. arranging said piezoceramic in said housing so that said contact surfaces of said piezoceramic are in electrically conductive contact with said contact sections of said contact element which are of corresponding polarity; and
b. closing said housing with a lid.

* * * * *